(12) United States Patent
Tailliet

(10) Patent No.: US 10,649,926 B2
(45) Date of Patent: May 12, 2020

(54) DETECTION OF A TIME CONDITION RELATIVE TO A TWO-WIRE BUS WHEN WRITING INTO AN EEPROM ON A I2C BUS

(71) Applicant: STMicroelectronics (Rousset) SAS, Rousset (FR)

(72) Inventor: Francois Tailliet, Fuveau (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 16/148,761

(22) Filed: Oct. 1, 2018

(65) Prior Publication Data

US 2019/0102328 A1   Apr. 4, 2019

(30) Foreign Application Priority Data

Oct. 2, 2017 (FR) ..................................... 17 59187

(51) Int. Cl.
| G06F 13/00 | (2006.01) |
| G06F 13/16 | (2006.01) |
| G11C 16/10 | (2006.01) |
| G11C 16/34 | (2006.01) |
| G06F 3/06 | (2006.01) |
| G06F 13/42 | (2006.01) |
| G06F 13/40 | (2006.01) |

(52) U.S. Cl.
CPC ........ *G06F 13/1668* (2013.01); *G06F 3/0611* (2013.01); *G06F 3/0659* (2013.01); *G06F 3/0679* (2013.01); *G06F 13/4072* (2013.01); *G06F 13/4282* (2013.01); *G11C 16/10* (2013.01); *G11C 16/349* (2013.01); *G06F 2213/0016* (2013.01)

(58) Field of Classification Search
CPC .................................................. G06F 13/1668
See application file for complete search history.

(56) References Cited

U.S. PATENT DOCUMENTS

| 5,925,135 | A | 7/1999 | Trieu et al. |
| 6,173,350 | B1 | 1/2001 | Hudson et al. |
| 6,532,506 | B1 * | 3/2003 | Dunstan ............... G06F 13/4295 326/86 |
| 9,343,157 | B2 * | 5/2016 | Tailliet ................. G11C 16/102 |
| 2002/0051506 | A1 | 5/2002 | Deas et al. |
| 2002/0082791 | A1 * | 6/2002 | Tailliet ................. G11C 7/1045 702/106 |
| 2018/0060269 | A1 * | 3/2018 | Kessler ............... G06F 13/4022 |

OTHER PUBLICATIONS

INPI Search Report and Written Opinion for FR 843758 dated Jun. 6, 2018 (7 pages).
System Management Interface Forum (smif) et al: "System Management Bus (SMBus) Specification Version 3.0", , Dec. 20, 2014 (Dec. 20, 2014) , XP055347689, Extrait de l'Internet: URL:http://smbus.org/specs/SMBus_3_0_20141220.pdf [extrait le Feb. 20, 2017] le document en entier.

* cited by examiner

*Primary Examiner* — Tammara R Peyton
(74) *Attorney, Agent, or Firm* — Crowe & Dunlevy

(57) ABSTRACT

A value representative of a duration of the low state of a synchronization signal on a bus is measured and then compared with a threshold value. The threshold value is stored in a memory and the measured value represents, in a first comparison, a longest duration of the low states of the synchronization signal.

40 Claims, 3 Drawing Sheets

DETECTION OF A TIME CONDITION RELATIVE TO A TWO-WIRE BUS WHEN WRITING INTO AN EEPROM ON A I2C BUS

PRIORITY CLAIM

This application claims the priority benefit of French Application for Patent No. 1759187, filed on Oct. 2, 2017, the content of which is hereby incorporated by reference in its entirety to the maximum extent allowable by law.

TECHNICAL FIELD

The present disclosure generally relates to electronic circuits, and more particularly to circuits capable of being connected to an I2C two-wire bus.

BACKGROUND

An I2C bus is a two-wire bus comprising two conductors respectively intended to transmit data in series and a synchronization signal. A SMB or SMBus (System Management Bus) is a specific I2C bus which further provides the detection of a time condition relative to the duration of the low state of the synchronization signal. More particularly, the SMB standard provides detecting whether the synchronization signal remains in the low state for a time longer than a given time period.

SUMMARY

An embodiment of the present disclosure overcomes all or part of the disadvantages of existing methods and/or circuits for detecting a time condition relative to the duration of the low state of the synchronization signal of an I2C bus, in particular of a SMB.

Another embodiment more particularly relates to the detection of a time condition relative to the duration of the low state of the synchronization signal of an I2C bus, in particular of a SMB, during the transmission of a byte over this bus.

Another embodiment does away with the manufacturing dispersions of a circuit verifying a time condition relative to the duration of the low state of the synchronization signal of an I2C bus, more particularly of a SMB.

Thus, an embodiment provides a method wherein a value representative of a duration of the low state of a synchronization signal of a bus is compared with a threshold stored in a memory, said value representing, in a first comparison, the longest duration of the low states of said signal.

According to an embodiment, in the first comparison, said value represents the longest duration of the low states of said signal having occurred before said first comparison.

According to an embodiment, the first comparison is performed after the reading of the threshold from the memory, said reading being performed synchronously with the synchronization signal.

According to an embodiment, the memory is a non-volatile memory.

According to an embodiment, the threshold stored in the memory is determined during a calibration phase.

According to an embodiment, the bus is an I2C bus, for example, a SMB.

According to an embodiment, the threshold is representative of a duration in the range from 25 to 35 ms.

According to an embodiment, the threshold is read from the memory during a first transmission of a byte over the bus after said bus has been set in operation.

According to an embodiment, the first comparison is performed before a time when an acknowledgement of said byte should be transmitted over said bus.

According to an embodiment, the first comparison is performed between the transmission of the last bit of said byte and said time.

Another embodiment also provides a device capable of implementing the above-mentioned method.

According to an embodiment, the device comprises an oscillator and a counter configured to count a number of periods of the oscillator during each low state of said signal, said value being determined based on the number of periods counted for each low state.

According to an embodiment, after each low state of said signal preceding the first comparison, said value is updated with the number of periods counter during the low state if said number is greater than said value.

According to an embodiment, the memory, the oscillator, and the counter also implement a presence detection function.

According to an embodiment, the memory is an EEPROM-type memory, the oscillator and the counter belonging to a circuit for writing into said memory.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
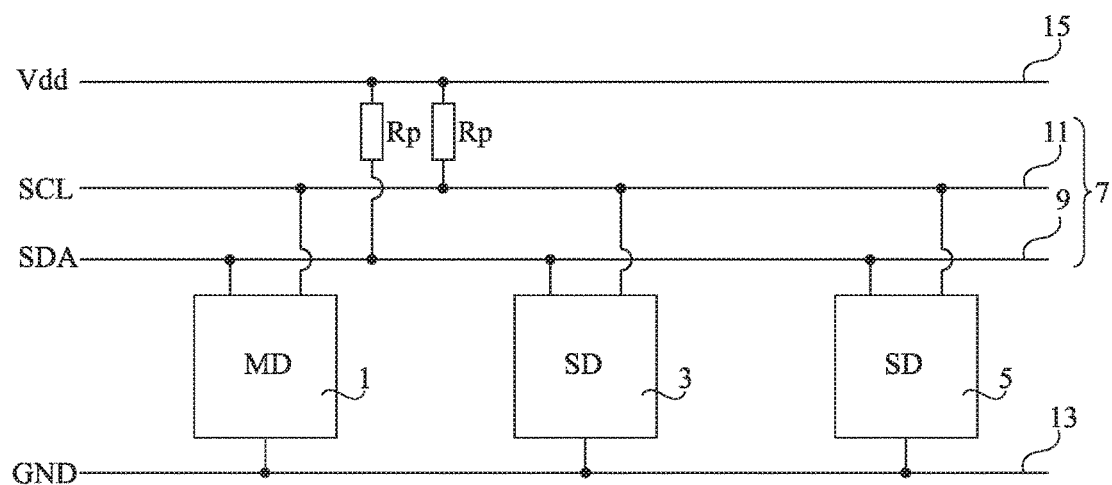
FIG. 1 is a simplified representation in the form of blocks of an electronic system comprising circuits connected to an I2C bus.

The same elements have been designated with the same reference numerals in the different drawings. For clarity, only those steps and elements which are useful to the understanding of the described embodiments have been shown and are detailed. In particular, the operation of a SMB has not been described in detail, the described embodiments being compatible with the usual operation of SMBs. Further, the operation of the devices or circuits connected to a SMB has not been described, the described embodiments being compatible with usual devices or circuits intended to be connected to a SMB.

In the following description, SMB designates a bus in accordance with the "System Management Bus" or SMBus standard, published on Dec. 20, 2014 and available at address http://smbus.org/specs/SMBus_3_0_20141220.pdf.

FIG. 1 is a simplified representation, in the form of blocks, of an electronic system comprising circuits 1, 3, 5 connected to an I2C bus 7. Bus 7 comprises a conductor 9 for transmitting a binary data signal SDA, and a conductor 11 for transmitting a binary synchronization signal SCL. Each circuit 1, 3, 5 is connected to conductors 9 and 11. Each circuit 1, 3, 5 is further connected to a conductor 13 set to a reference potential, typically ground GND. Circuits 1, 3, 5 and other circuits connected to bus I2C or belonging to the same electronic circuit may be powered under a same voltage or under different voltages. For example, circuits 1, 3, and 5 are connected to a conductor 15 set to a power supply potential Vdd which is positive with respect to ground GND. Conductors 9 and 11 are individually connected by pull-up resistors Rp to conductor 15. Thus, in the idle state, signals SDA and SCL are at a potential close to potential Vdd representing one of the two binary states (high state) of signals SDA and SCL, the other binary state (low state) of signals SDA and SCL being represented by ground potential GND.

The I2C protocol provides that, for a transmission over bus 7, one of the circuits, for example, circuit 1, is used as a master device (MD) and imposes synchronization signal SCL. The other circuits, for example, 3 and 5, connected to the bus then have the status of a slave device (SD) to receive the data transmitted by circuit 1. These data may be directed towards a plurality of slave circuits or towards a single one of them. A same circuit may now have the master function and then a slave function, according to the communication direction.

Figure 2:
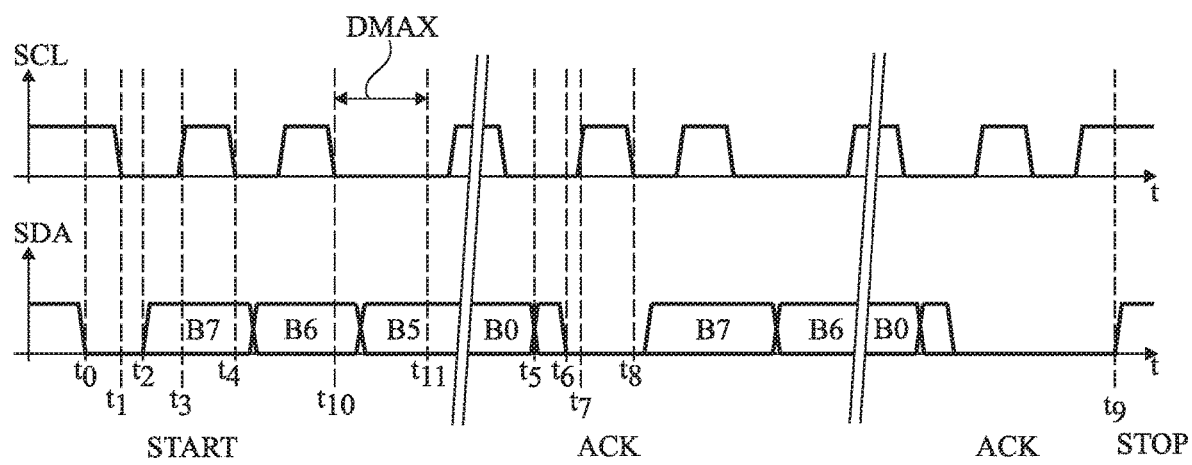
FIG. 2 shows timing diagrams very schematically illustrating a communication according to the I2C protocol between two circuits of the electronic system of FIG. 1.

FIG. 2 shows timing diagrams very schematically illustrating a communication according to the I2C protocol between two circuits of the electronic system of FIG. 1. The timing diagrams, drawn out of scale, represent examples of the shape of signal SCL and of signal SDA.

The I2C protocol defines a communication start condition START by a switching of signal SDA to the low state (time $t_0$) while signal SCL is in the high state. This switching is caused by that one of the circuits which takes the master status for the communication. The different slave circuits monitor the respective states of signals SCL and SDA and detect condition START indicating that a communication will start.

The master circuit, here circuit 1, then transmits a first byte. For this purpose, after having switched signal SCL to the low level at a time $t_1$ subsequent to time to, master circuit 1 imposes the state of signal SDA at a time $t_2$ subsequent to time $t_1$, according to the state of the first bit B7 of the byte to be transmitted, and then releases signal SCL to the high state at a time $t_3$ subsequent to time $t_2$. The state of signal SDA is read by the slave circuits, here circuit 3 and circuit 5, at time $t_3$, during the next rising edge of signal SCL. When signal SCL returns to the low state, at a time $t_4$ subsequent to time $t_3$, master circuit 1 continues the operation with the next bits B6, B5 . . . B0, until the entire byte has been transmitted. Most often, the first byte sent by master circuit 1 comprises seven address bits identifying the addressee circuit, followed by a bit indicating the operation (reading/writing) desired by the master circuit. The different slave circuits detect the transmitted data and, in particular, determine based on the first byte forming the addressee's address whether or not the next byte(s) are intended for them.

At the end of the last bit B0 (time $t_5$) of the first byte, while the master circuit imposes signal SCL in the low state, it releases signal SDA to the high state. The slave circuit identified by the transmitted address, for example, circuit 3, acknowledges (ACK) the transmitted byte by switching signal SDA to the low state at a time $t_6$ subsequent to time $t_5$. This low state of signal SDA is detected by master circuit 1 at the next rising edge of signal SCL, at a time $t_7$ subsequent to time $t_6$. When signal SCL switches back to the low state, at a time $t_8$ subsequent to time $t_7$, master circuit 1 can transmit the next byte and so on until the end of the communication.

Once the next byte(s) have been transmitted, an acknowledgement ACK having been received from slave circuit 3 after the transmission of each byte, master circuit 1 imposes a stop condition STOP by releasing signal SDA to the high state (time $t_9$) while signal SCL is in the high state. The different slave circuits 3 and 5 which monitor signals SCL and SDA detect condition STOP indicating that the communication is over. Circuits 1, 3, and 5 connected to the bus are then placed in a state where they wait for a new communication, in other words, for a new condition START. For example, each circuit 1, 3, 5 comprises an interface for reading/writing over bus 7 which is then set to this state of waiting for a new condition START.

In the case (not shown in FIG. 2) where no slave circuit sends an acknowledgement after the transmission of a byte by the master circuit, signal SDA remains in the high state after the transmission of the last bit of the byte. Master circuit 1 detects the absence of an acknowledgement ACK at the next rising edge of signal SCL. It can then transmit a new condition START, also called condition RESTART, or a condition STOP.

The SMB protocol provides, in addition to the above-described operation, detecting when signal SCL remains blocked in the low state longer than a given maximum time period DMAX identical for all the circuits connected to the bus. Time period DMAX is in the range from 25 to 35 ms, for example, 30 ms, and is represented as an illustration between times $t_{10}$ and $t_{11}$ in FIG. 2.

To verify that the duration of each low state of signal SCL remains lower than a selected time period DMAX, it is provided that each circuit connected to the bus comprises a circuit capable of supplying, for each low state of signal SCL, a value representative of the duration of this low state, which is then compared with a threshold representative of time period DMAX. For example, the duration of a low state of signal SCL may be represented by a number of periods of an oscillator counted during this low state, this number being then compared with the number of periods of the oscillator corresponding to time period DMAX, that is, to the threshold representative of time period DMAX.

It could be provided that, for a selected time period DMAX, the threshold representative of time period DMAX is identical for a plurality of circuits. For example, each of these circuits may comprise a register having its content initialized to contain the threshold. The threshold would then be available as soon as the circuit is powered on. However, due to the manufacturing dispersions between identical circuits, the value representative of a same duration of the low state of signal SCL may be different from one circuit to another. This might result in the detection by a circuit that the duration of this low state SCL exceeds the selected time period DMAX while another circuit, identical though it may be, does not detect this.

It is thus provided to calibrate a threshold TIMEOUT for each circuit to take into account manufacturing dispersions between identical circuits, the calibrated threshold being then stored in a non-volatile memory of the circuit. It could be provided for the calibrated threshold stored in the memory to be read out as soon as the circuit is powered on, but this would require a specific readout device and a synchronization signal specific to this readout device.

In the above-described embodiments, an initialization phase during which the threshold representative of time period DMAX is read out from the non-volatile memory is provided, this initialization phase being implemented in each circuit connected to the bus. The initialization phase starts at the same time as the beginning of the transmission of a byte over the bus and ends before the time when the acknowledgement ACK of this byte should be generated. In other words, the initialization phase occurs during the transmission of the byte. The initialization phase is more particularly implemented during the transmission of the first byte over the bus after the circuits connected to the bus have been powered on.

As an example, the beginning of the initialization phase corresponds to the detection of condition START indicating the beginning of a communication and the initialization phase is carried out during the transmission of the first byte of this communication.

In the initialization phase, the threshold representative of time period DMAX is read from the memory synchronously with signal SCL, at the same time as a value representative of the longest duration of the low state of signal SCL is determined. At the end of the initialization phase, if the determined value is greater than the read threshold, at least one of the low states of signal SCL has lasted longer than time period DMAX. Each circuit is then placed in the same state as if it had received a condition STOP, for example, by resetting its bus read/write interface, and the circuit meant to generate acknowledgement ACK of the transmitted byte during the initialization phase will generate no acknowledgement ACK for this byte. Thus, the verification of the fact that a duration of the low state of signal SCL has exceeded threshold time period DMAX is performed while the first durations of the low state of signal SCL have been measured before the reading of the threshold representative of time period DMAX. This enables to simplify the reading of the threshold from the memory, which reading can then be performed synchronously with signal SCL, in the same way as a conventional reading of data from a memory. In practice, the transmission of a byte over the bus can be interrupted if a new condition START is transmitted before the time when acknowledgment ACK of the byte should be generated. In this case, if an initialization phase is going on, it is interrupted and canceled, and a new initialization phase is implemented at the next transmission of a byte over the bus.

Advantage is here taken from the fact that, during the transmission of a byte, preferably the first byte transmitted after the powering on of the circuits connected to the bus, if at least one low state of signal SCL during this transmission lasts longer than time period DMAX, this has no influence, in particular for the master circuit, before the time when acknowledgement ACK of the transmitted byte should be generated. Advantage is also taken from the fact that the reading from the memory of the threshold representative of time period DMAX, synchronously with signal SCL, has ended before the time when the acknowledgement ACK of this byte should be generated.

Many circuits intended to be connected to a SMB already comprise a non-volatile memory, for example, of EEPROM type, and a circuit for reading from this memory synchronized with signal SCL. Advantage is then taken from the fact that the threshold representative of time period DMAX may be stored in this existing memory and be read out by the circuit for reading from this memory, without using a specific readout circuit. A specific example of circuits comprising a non-volatile memory, for example, of EEPROM type, and a device for reading from this memory are the circuits implementing a presence detection function, this function being generally designated with acronym SPD for "Serial Presence Detect". This function is for example implemented for DRAM-type (Dynamic Random Access Memory) memory circuits by providing an EEPROM where information relative to the operation of the DRAM is stored, for example, information relative to the time of access to this DRAM.

Figure 3:
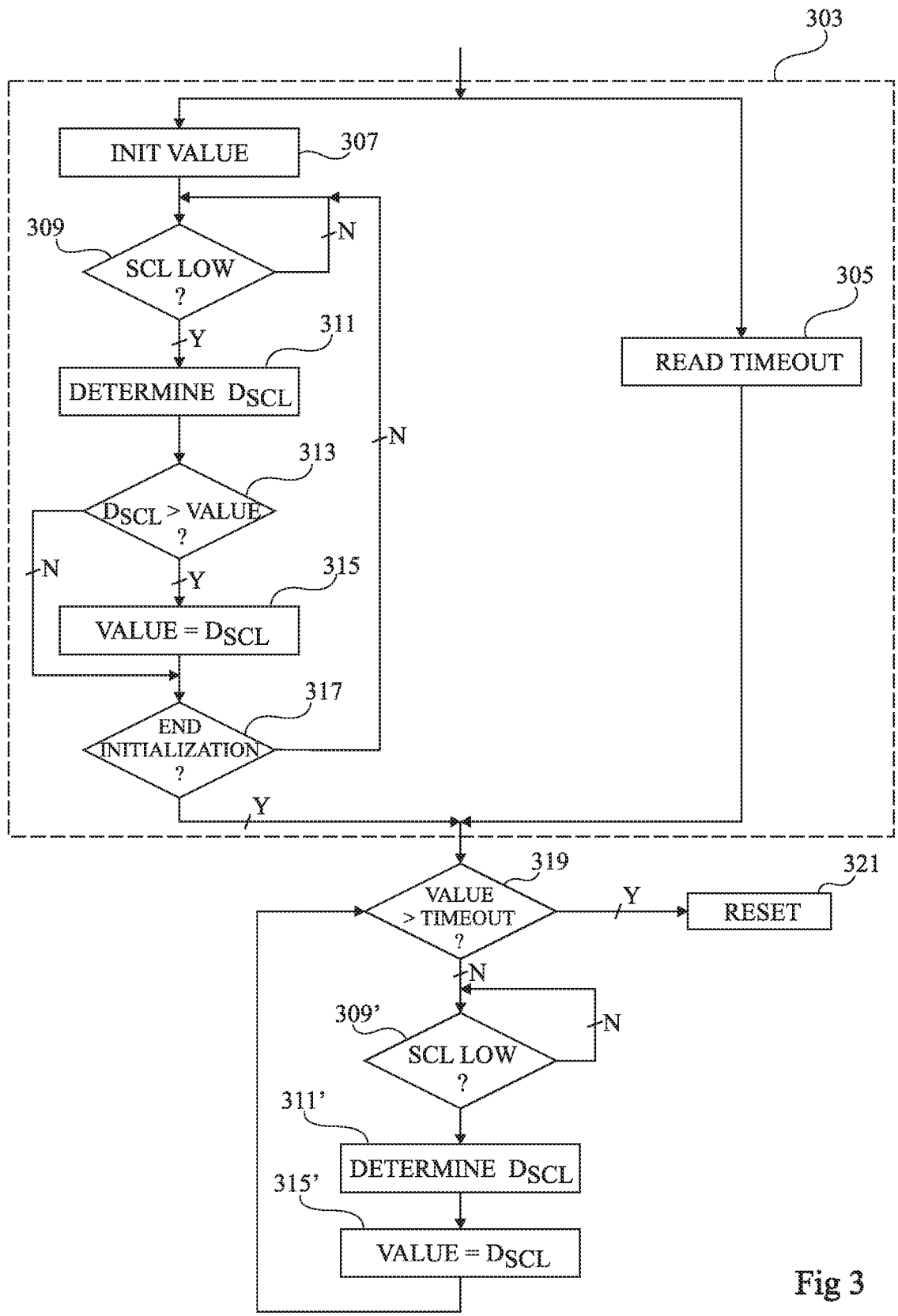
FIG. 3 is a flowchart illustrating an embodiment of a method of detecting a time condition relative to the duration of a low state of a synchronization signal of the bus of FIG. 1.

FIG. 3 is a flowchart illustrating an embodiment of a method of detecting a time condition relative to the duration of the low state of the synchronization signal of the bus of FIG. 1, the method being for example implemented by each of circuits 1, 3, and 5 connected to the bus.

The method starts with an initialization phase 303 during which a threshold TIMEOUT representative of time period DMAX is read out from the memory at a step 305 (READ TIMEOUT) carried out in parallel with steps 307, 309, 311, 313, 315, and 317 of determining a value representative of the longest duration in the low state of signal SCL during initialization phase 303. As previously indicated, this initialization phase starts at the same time as the beginning of the transmission of a byte over the bus, for example, the first byte transmitted after the circuits to the bus have been powered on.

In initialization phase 303, a value VALUE is initialized, for example at zero, at a step 307 (INIT VALUE) carried out before the first low state of signal SCL following the beginning of initialization phase 303 (between times $t_0$ and $t_1$ in FIG. 2). Step 307 is followed by a step 309 (SCL LOW?) of detecting the switching of signal SCL to the low state. When signal SCL switches to the low state (output Y of block 309), a value $D_{SCL}$ representative of the duration of this low state is determined at a next step 311 (DETERMINE $D_{SCL}$). Step 311 is followed by a step 313 ($D_{SCL}$>VALUE?) where value $D_{SCL}$ is compared with value VALUE. If value $D_{SCL}$ is greater than value VALUE (output Y of block 313), value VALUE is updated with value $D_{SCL}$ at a next step 315 (VALUE=$D_{SCL}$) before a step 317 (END INITIALIZATION?). Otherwise (output N of block 313), step 313 is directly followed by step 317.

Step 317 comprises verifying whether the initialization phase has ended. If initialization phase 303 has not ended (output N of block 317), steps 309, 311, 313, 317 and possibly 315 are carried out again. Thus, during the initialization phase, the loop comprising steps 309, 311, 313, 315, and 317 is executed once for each period of signal SCL. If initialization phase 303 has ended (output Y of block 317), value VALUE is compared with threshold TIMEOUT at a next step 319 (VALUE<TIMEOUT?). According to an embodiment, initialization phase 303 ends at the eighth rising edge of signal SCL following the beginning of initialization phase 303. In an alternative embodiment, initialization phase 303 ends at a given rising edge of signal SCL for which it is known that the reading of the threshold representative of time period DMAX has ended, the given rising edge being prior to the eighth rising edge of signal SCL following the beginning of initialization phase 303.

During first comparison 319, value VALUE represents the longest duration in the low state of signal SCL during initialization phase 303. In the case where initialization phase 303 ends at the eighth rising edge of signal SCL following the beginning of initialization phase 303, this first comparison 319 is for example carried out before the falling edge of signal SCL following this eighth rising edge, so that the result of this first comparison 319 is known before the time when acknowledgement ACK of the byte transmitted during the initialization phase should be generated (time $t_6$ in FIG. 2). In the case where initialization phase 303 ends at a given rising edge of signal SCL prior to the eighth rising edge of signal SCL following the beginning of this initialization phase, the first comparison 319 is for example performed between this given rising edge and the next falling edge of signal SCL.

If, at step 319, value VALUE is greater than threshold TIMEOUT (output Y of block 319), at least one low state of signal SCL during initialization phase 303 has lasted longer than time period DMAX. At a next step 321 (RESET), the circuit implementing the method is then placed in the same state as if it had received a condition STOP. Otherwise (output N of block 319), in the embodiment illustrated in FIG. 3, this circuit verifies whether each next low state of signal SCL lasts longer than time period DMAX. To achieve this, the switching of signal SCL to the low state is detected at a step 309' (SCL LOW?) consecutive to step 319 and, when signal SCL switches to the low state (output Y of block 309'), the value $D_{SCL}$ of this low state is determined at a next step 311' (DETERMINE $D_{SCL}$), step 311' being for example identical to step 311. Value VALUE is then updated with value DSCL, at a step 315' (VALUE=$D_{SCL}$), before carrying out again step 319, where value VALUE now represents the duration of the last low state of signal SCL.

In an alternative embodiment, step 315' is replaced with a step of comparing threshold TIMEOUT directly with value $D_{SCL}$ determined at the previous step 311'. If value DSCL is greater than threshold TIMEOUT, the next step is step 321, otherwise the next step is step 309'.

In another alternative embodiment, a step similar or identical to step 313 is provided between steps 311' and 315' so that value VALUE is updated with the last value $D_{SCL}$ only if value $D_{SCL}$ represents the longest duration of the low states of signal SLC which have already occurred.

In another alternative embodiment, initialization phase 303 is carried out for each byte transmitted over the bus. Preferably, each initialization phase then ends at the eighth rising edge following the beginning of this initialization phase. Further, in this variation, it is preferably provided for initialization phase 303 to comprise two additional steps. The first one of the two additional steps is for example performed between steps 317 and 319 and comprises modifying the state of a flag to indicate that the threshold has been read. The second of the two additional steps is for example carried out just before step 305 (right-hand branch in FIG. 3) and comprises verifying the state of the flag, so that, if the flag indicates that threshold TIMEOUT has already been read during a previous initialization phase 303, step 305 is not carried out. Thus, threshold TIMEOUT will only be read once, at a first initialization phase 303, which enables to limit read accesses to the memory having threshold TIMEOUT stored therein, and thus to decrease the electric power consumption of the circuit implementing initialization phases 303. Preferably, the first initialization phase during which threshold TIMEOUT is read starts with the detection of a condition START. Advantage is then taken from the fact that the reading of threshold TIMEOUT from the memory is performed during the transmission of the byte formed of the address identifying the addressee circuit and of the bit indicative of the desired operation (reading/writing), which enables to avoid for the threshold to be read from the memory at the same time as data to be transmitted over the bus. As an example, the flag corresponds to a bit having a first binary state indicating that threshold TIMEOUT has not been read yet, and having its second binary state indicating that threshold TIMEOUT has already been read.

Although this has not been shown in FIG. 3, if a new condition START is transmitted during an initialization phase 303, as previously indicated, this initialization phase is interrupted and canceled, and a new initialization phase 303 is implemented during the next transmission of a byte.

In the following description, the case where each circuit implementing the method of FIG. 3 comprises an oscillator and a counter synchronized with this oscillator is considered, the period of the signal supplied by the oscillator being shorter than that of signal SCL of the bus to which the circuit is intended to be connected. For each low state of signal SCL, value $D_{SCL}$ then corresponds to the number of periods of this oscillator counted during this low state. The calibrated threshold TIMEOUT of the circuit is determined by means of the oscillator and of the counter of this circuit, by counting the number of periods of this oscillator during time period DMAX. Calibrated threshold TIMEOUT is then equal to the number of periods counted during time period DMAX, that is, to the content of the counter at the end of time period DMAX, and is recorded in the circuit memory. This calibration phase is implemented, with the same time period DMAX, for each circuit intended to be connected to a same bus.

Figure 4:
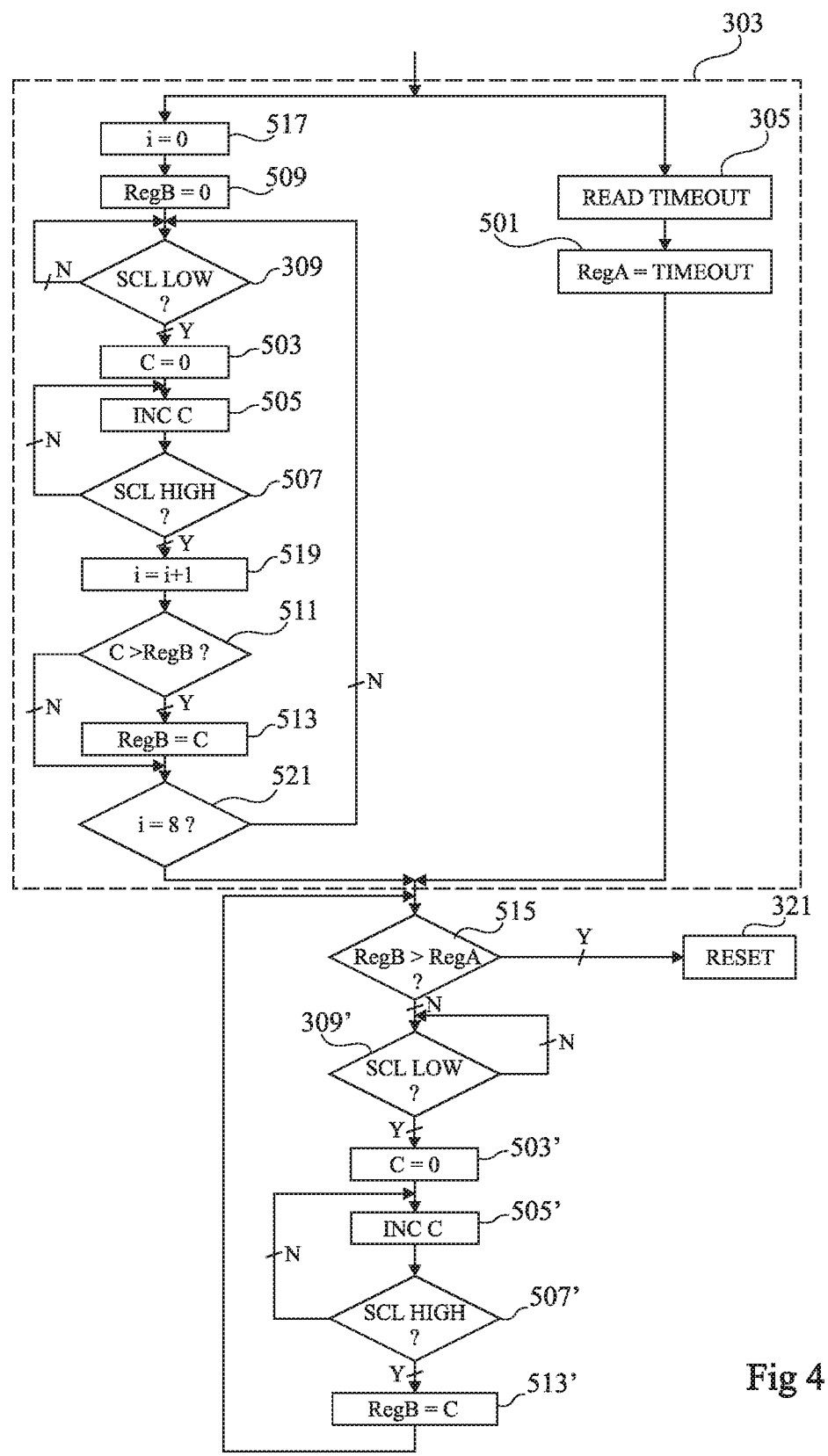
FIG. 4 is a timing diagram illustrating a more detailed embodiment of the method of FIG. 3.

FIG. 4 is a timing diagram illustrating a more detailed embodiment of the method of FIG. 3, for example, implemented with an EEPROM-type memory. The method of FIG. 4 comprises steps already described in relation with FIG. 3, designated with the same reference numerals, which will not be described again.

In this embodiment, step 305 of reading threshold TIMEOUT from the memory, here, an EEPROM-type non-volatile memory, is followed by a step 501 (RegA=TIMEOUT) of writing threshold TIMEOUT into a first register RegA. The duration of a low state of signal SCL is represented by the number of periods of an oscillator counted by a counter C associated with the oscillator, for example, the oscillator and the counter of a circuit for writing into the EEPROM. As compared with FIG. 3, step 311 is replaced with equivalent steps 503, 505, and 507. At step 503, immediately after a low state of signal SCL is detected (output Y of block 309), counter C is initialized at zero (C=0) and then, at the next step 505 (INC C), counter C is incremented once, synchronously with the oscillator. After step 505, step 507 (SCL HIGH?) comprises verifying whether signal SCL has switched to the high state. If not (output N of block 507), signal SCL is still in the low state and step 505 of incrementing the counter is carried out again. Otherwise (output Y of block 507), signal SCL is in the high state and the content of counter C then represents the duration of the last low state of signal SCL. Similarly, step 311' (FIG. 3) is replaced with equivalent steps 503', 505', and 507', steps 503', 505', and 507' being respectively identical to steps 503, 505, and 507.

Further, in this embodiment, value VALUE described in relation with FIG. 3 corresponds to the content of a second register RegB. Step 307 (FIG. 3) is thus replaced with an equivalent step 509 (RegB=0) of initializing register RegB and step 313 is replaced with an equivalent step 511 (C>RegB?) of comparing the content of counter C with that of register RegB. At step 511, if the content of counter C is greater than that of register RegB (output Y of block 511), register RegB is updated with the content of counter C at the next step 513 (RegB=C). Similarly, step 315' (FIG. 3) is replaced with an equivalent step 513' identical to step 513. Further, step 319 of comparing value VALUE with threshold TIMEOUT is replaced with an equivalent step 515 (RegB>RegA?) of comparing the content of register RegB with that of register RegA.

A step 517 (i=0) of initializing to zero a loop variable i is performed at the beginning of initialization phase 303, for example just before step 509 as is the case herein, it being understood that step 517 may be carried out in parallel with step 509 or just after step 509. For each detection of a rising edge of signal SCL (output Y of block 507), loop variable i is incremented at a step 519 (i=i+1), for example, carried out between steps 507 and 511.

In this embodiment, initialization phase 303 ends at the eighth rising edge of signal SCL following the beginning of this initialization. Step 317 is then replaced with an equivalent step 521 (i=8?) comprising verifying whether variable i is equal to 8, that is, whether this eighth rising edge of signal SCL has just occurred, which marks the end of initialization phase 303.

Thus, during first comparison 515 after initialization phase 303, a value VALUE, representative of the longest duration in the low state and stored in register RegB, is effectively compared with threshold TIMEOUT read from the memory and stored in register RegA.

The alternative embodiments described in relation with FIG. 3 can be transposed to the embodiment described in relation with FIG. 4.

Specific embodiments have been described. Various alterations, modifications, and improvements will readily occur to those skilled in the art. In particular, the electronic system of FIG. 1 may comprise a number of circuits different from what is shown in this drawing.

The circuits capable of implementing the method of FIGS. 3 and 4 are not limited to circuits comprising an EEPROM-type non-volatile memory and its readout circuit, it being within the abilities of those skilled in the art to design, based on the above description, other circuits capable of implementing this method.

It is also within the abilities of those skilled in the art to adapt the number of steps and/or the steps of the method of FIGS. 3 and 4. For example, step 503 of initializing counter C may be performed before step 309, between step 501 and step 309 while initialization phase 303 has not ended (branch N of block 501). Further, the previously-described method and calibration phase may also be adapted to the case where the duration of each low state of signal SCL is represented by a value determined with a down counter rather than with a counter, and more generally to the case where the durations are represented otherwise than by numbers of oscillator periods, for example, by voltage levels.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method, comprising:
comparing a value representative of a duration of a low state of a synchronization signal transmitted on a synchronization line of a bus to a threshold value stored in a memory;
wherein said value represents, in a first comparison, a longest duration of the low state of said synchronization signal detected during transmission over a data line of the bus of a first byte after said bus has been set in operation.

2. The method of claim 1, wherein, in the first comparison, said value represents the longest duration of the low state of said synchronization signal which has occurred for bits of the first byte transmitted before performing said first comparison.

3. The method of claim 1, further comprising reading of the threshold from the memory and wherein the first comparison is performed after the reading of the threshold from the memory, wherein the reading is performed synchronously with transmission of the synchronization signal.

4. The method of claim 1, wherein the memory is a non-volatile memory.

5. The method of claim 1, further comprising determining the threshold value stored in the memory during performance of a calibration phase.

6. The method of claim 1, wherein the bus is an I2C bus.

7. The method of claim 6, wherein the threshold value is representative of a duration in a range from 25 to 35 ms.

8. The method of claim 6, further comprising reading the threshold value from the memory during transmission of the first byte.

9. The method of claim 8, further comprising performing said first comparison before an acknowledgement of said first byte is transmitted over said bus.

10. The method of claim 9, further comprising performing said first comparison between a transmission of a last bit of said first byte and transmission of said acknowledgement.

11. A device configured for connection to the bus and configured to implement the method of claim 1.

12. The device of claim 11, comprising an oscillator and a counter configured to count a number of periods of the oscillator during each low state of said synchronization signal, said value being determined based on the number of periods counted during each low state.

13. The device of claim 12, wherein, after each low state of said synchronization signal preceding the first comparison, said value is updated with the number of periods counted during the low state if said number is greater than said value.

14. The device of claim 12, wherein the memory, the oscillator, and the counter also implement a presence detection function.

15. The device of claim 12, wherein the memory is an EEPROM-type memory, the oscillator and the counter belonging to a circuit for writing into said memory.

16. A method, comprising:
transmitting a start byte by a master device over an SDA line of an I2C bus;
measuring a maximum duration of a low state of a synchronization signal transmitted over an SCL line of said I2C bus during transmission of the start byte;
retrieving a threshold value from a memory in response to transmission of the start byte;
comparing the maximum duration to the threshold value; and
resetting communication over the I2C bus if the maximum duration exceeds the threshold value.

17. The method of claim 16, wherein the memory is a non-volatile memory.

18. The method of claim 17, further comprising determining the threshold value stored in the memory during performance of a calibration phase.

19. The method of claim 17, further comprising performing said comparison before an acknowledgement of said start byte is transmitted over said bus.

20. The method of claim 19, further comprising performing said comparison between a transmission of a last bit of said start byte and transmission of said acknowledgement.

21. A device configured for connection to the I2C bus and configured to implement the method of claim 17.

22. The device of claim 21, comprising an oscillator and a counter configured to count a number of periods of the oscillator during each low state of said synchronization signal, said value being determined based on the number of periods counted during each low state.

23. The device of claim 22, wherein, after each low state of said synchronization signal preceding the comparing, said value is updated with the number of periods counted during the low state if said number is greater than said value.

24. The device of claim 22, wherein the memory, the oscillator, and the counter also implement a presence detection function.

25. The device of claim 22, wherein the memory is an EEPROM-type memory, the oscillator and the counter belonging to a circuit for writing into said memory.

26. A method, comprising:
storing in a memory of a circuit configured to access a bus a threshold value which is calibrated for said circuit to take into account manufacturing dispersions between circuits; and
comparing said threshold value stored in said memory to a value representative of a duration of a low state of a synchronization signal transmitted on a bus to said circuit;
wherein said value represents, in a first comparison, a longest duration of the low state of said synchronization signal during transmission of a data byte on said bus.

27. The method of claim 26, further comprising:
reading the threshold value from said memory; and
wherein, in the first comparison, said value represents the longest duration which has occurred during a time period that is required to read the threshold value from the memory.

28. The method of claim 26, wherein the reading is performed synchronously with transmission of the synchronization signal.

29. The method of claim 26, wherein the memory is a non-volatile memory.

30. The method of claim 26, wherein the bus is an I2C bus.

31. The method of claim 30, wherein the threshold value is representative of a duration in a range from 25 to 35 ms.

32. The method of claim 30, further comprising reading the threshold value from the memory during transmission of a data byte on the bus.

33. The method of claim 32, further comprising performing said first comparison before an acknowledgement of said data byte is transmitted over said bus.

34. The method of claim 33, further comprising performing said first comparison between a transmission of a last bit of said data byte and transmission of said acknowledgement.

35. The method of claim 26, wherein the data byte is a start byte for initiating transmission on the bus.

36. A device configured for connection to the bus and configured to implement the method of claim 26.

37. The device of claim 36, comprising an oscillator and a counter configured to count a number of periods of the oscillator during each low state of said synchronization signal, said value being determined based on the number of periods counted during each low state.

38. The device of claim 37, wherein, after each low state of said synchronization signal preceding the first comparison, said value is updated with the number of periods counted during the low state if said number is greater than said value.

39. The device of claim 37, wherein the memory, the oscillator, and the counter also implement a presence detection function.

40. The device of claim 37, wherein the memory is an EEPROM-type memory, the oscillator and the counter belonging to a circuit for writing into said memory.

* * * * *